United States Patent
Wu et al.

(10) Patent No.: US 12,484,265 B2
(45) Date of Patent: Nov. 25, 2025

(54) SUBTRACTIVE SOURCE DRAIN CONTACT FOR STACKED DEVICES

(71) Applicant: INTERNATIONAL BUSINESS MACHINES CORPORATION, Armonk, NY (US)

(72) Inventors: Heng Wu, Santa Clara, CA (US); Junli Wang, Slingerlands, NY (US); Ruilong Xie, Niskayuna, NY (US); Albert M. Young, Fishkill, NY (US); Albert M. Chu, Nashua, NH (US); Brent A. Anderson, Jericho, VT (US); Ravikumar Ramachandran, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 644 days.

(21) Appl. No.: 17/808,124

(22) Filed: Jun. 22, 2022

(65) Prior Publication Data

US 2023/0420502 A1    Dec. 28, 2023

(51) Int. Cl.
| | | |
|---|---|---|
| H10D 62/10 | (2025.01) | |
| H10D 30/01 | (2025.01) | |
| H10D 30/43 | (2025.01) | |
| H10D 30/67 | (2025.01) | |
| H10D 84/01 | (2025.01) | |
| H10D 84/03 | (2025.01) | |

(52) U.S. Cl.
CPC ......... *H10D 62/121* (2025.01); *H10D 30/014* (2025.01); *H10D 30/43* (2025.01); *H10D 30/6713* (2025.01); *H10D 30/6757* (2025.01); *H10D 84/0128* (2025.01); *H10D 84/013* (2025.01); *H10D 84/038* (2025.01)

(58) Field of Classification Search
CPC .... H10D 62/121; H10D 30/014; H10D 30/43; H10D 30/6713; H10D 30/6757; H10D 84/0128; H10D 84/013; H10D 84/038; H10D 84/0177; H10D 84/0186; H10D 30/0212; H10D 30/6729; H10D 30/6735; H10D 62/151; H10D 64/017; H10D 64/256; H10D 88/00; H10D 88/01; B82Y 10/00

See application file for complete search history.

(56) References Cited

U.S. PATENT DOCUMENTS

| | | | |
|---|---|---|---|
| 9,659,963 | B2 | 5/2017 | Cheng |
| 10,192,867 | B1 | 1/2019 | Frougier |

(Continued)

*Primary Examiner* — William B Partridge
*Assistant Examiner* — Chevy J Boegel
(74) *Attorney, Agent, or Firm* — Steven M. Bouknight

(57) ABSTRACT

A field effect transistor ("FET") stack, including a lower FET, and an upper FET, a first contact to a lower source drain of the lower FET, a first silicide between the first contact and the lower source drain, the first contact is adjacent to a vertical side surface of the lower source drain, a first overlap region between the first silicide and the first contact is less than a second overlap region between the first silicide and the first source drain. The first contact has a reverse tapper metal stud profile. Forming a first contact to a lower source drain of a lower FET of an FET stack, forming a first silicide between the first contact and the lower source drain, the first contact is adjacent to a vertical side surface of the lower source drain.

20 Claims, 12 Drawing Sheets

Section Y-Y

(56) References Cited

U.S. PATENT DOCUMENTS

| | | |
|---|---|---|
| 10,283,411 B1 | 5/2019 | Hook |
| 10,510,622 B1 | 12/2019 | Frougier |
| 10,770,479 B2 | 9/2020 | Smith |
| 2020/0075574 A1 | 3/2020 | Smith |
| 2020/0373203 A1 | 11/2020 | Liebmann |
| 2021/0202500 A1 | 7/2021 | Chanemougame |
| 2021/0217654 A1 | 7/2021 | Xie |
| 2021/0343639 A1* | 11/2021 | Wang ................ H01L 21/76897 |

* cited by examiner

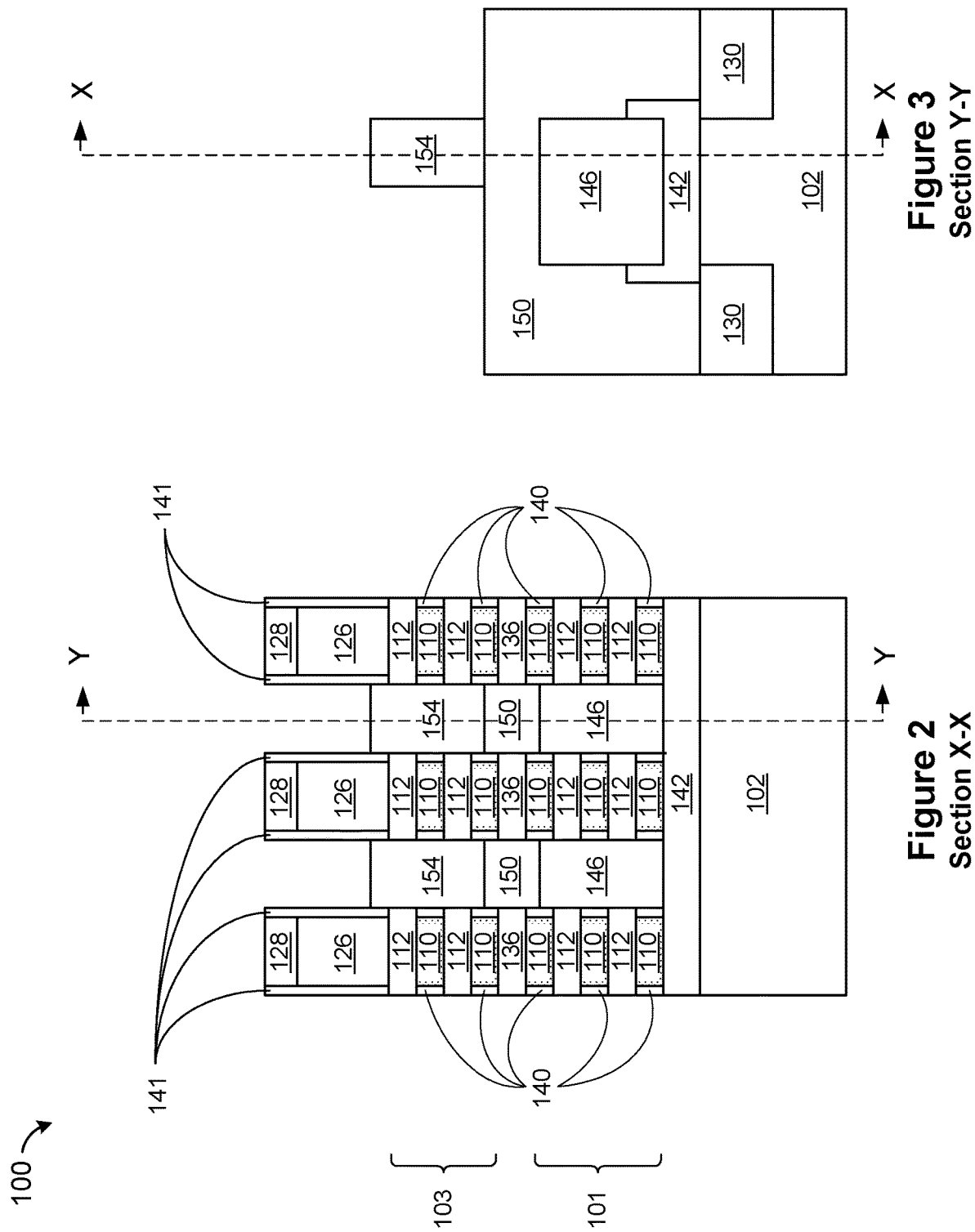

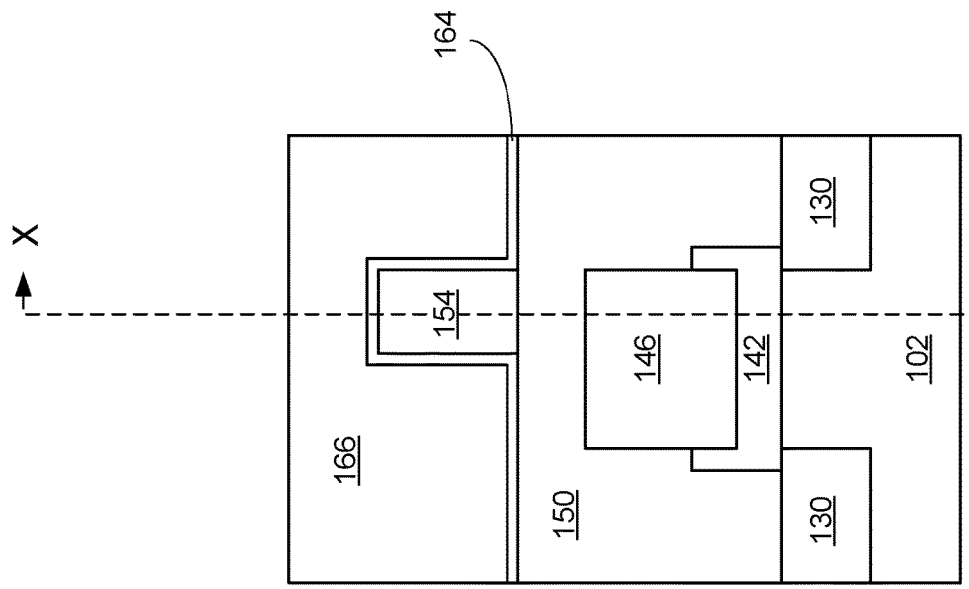
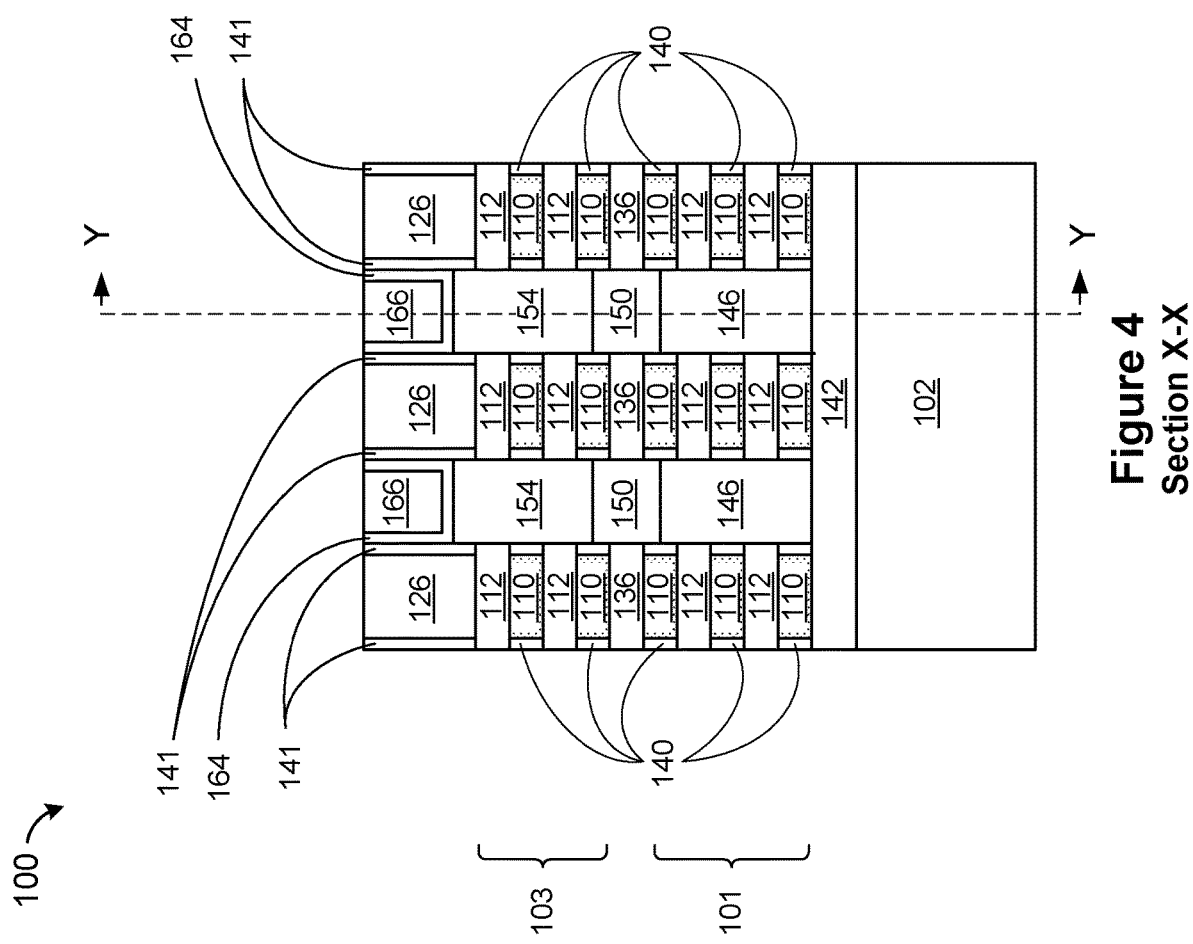
Figure 5
Section Y-Y
Figure 4
Section X-X

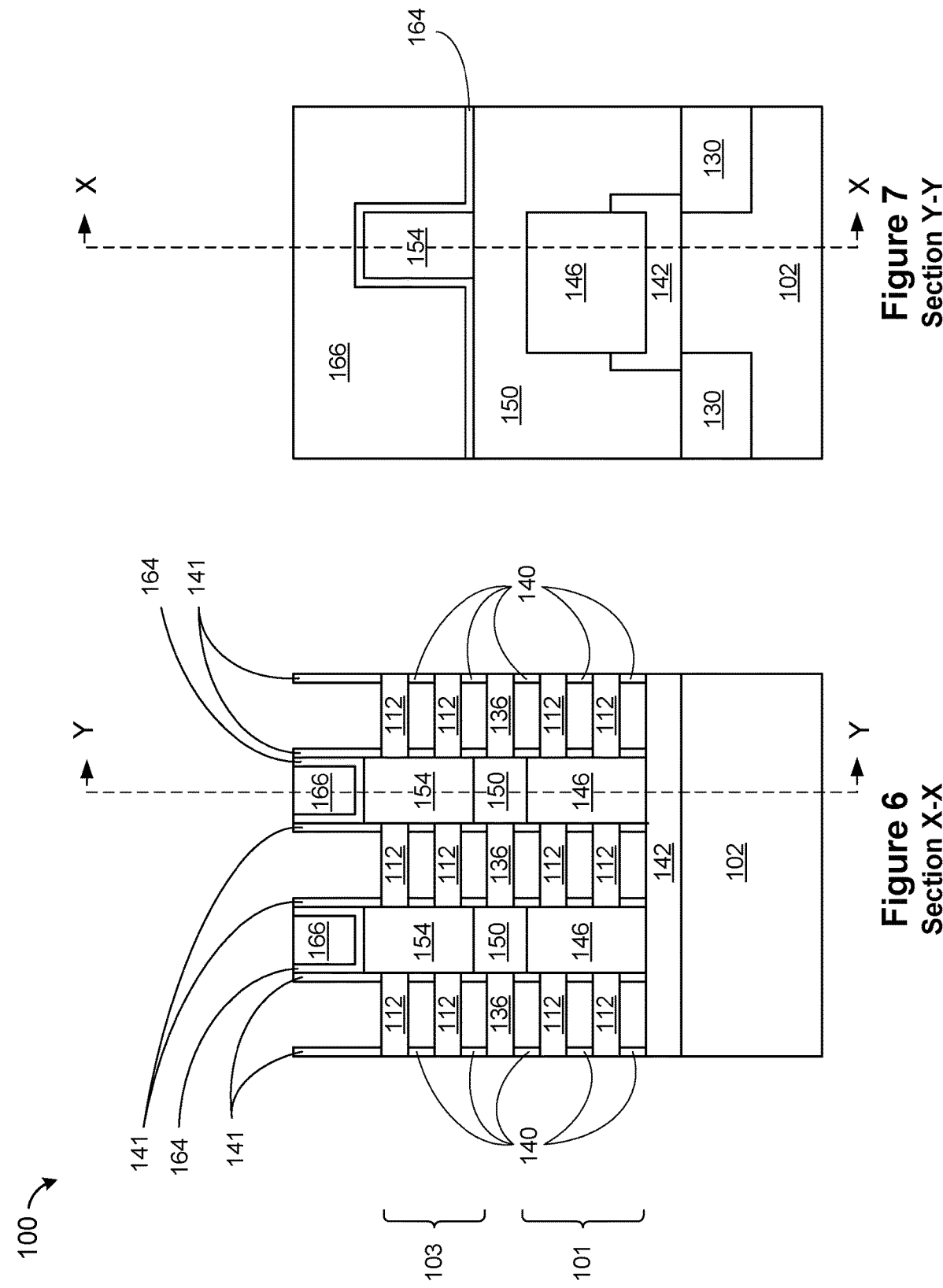

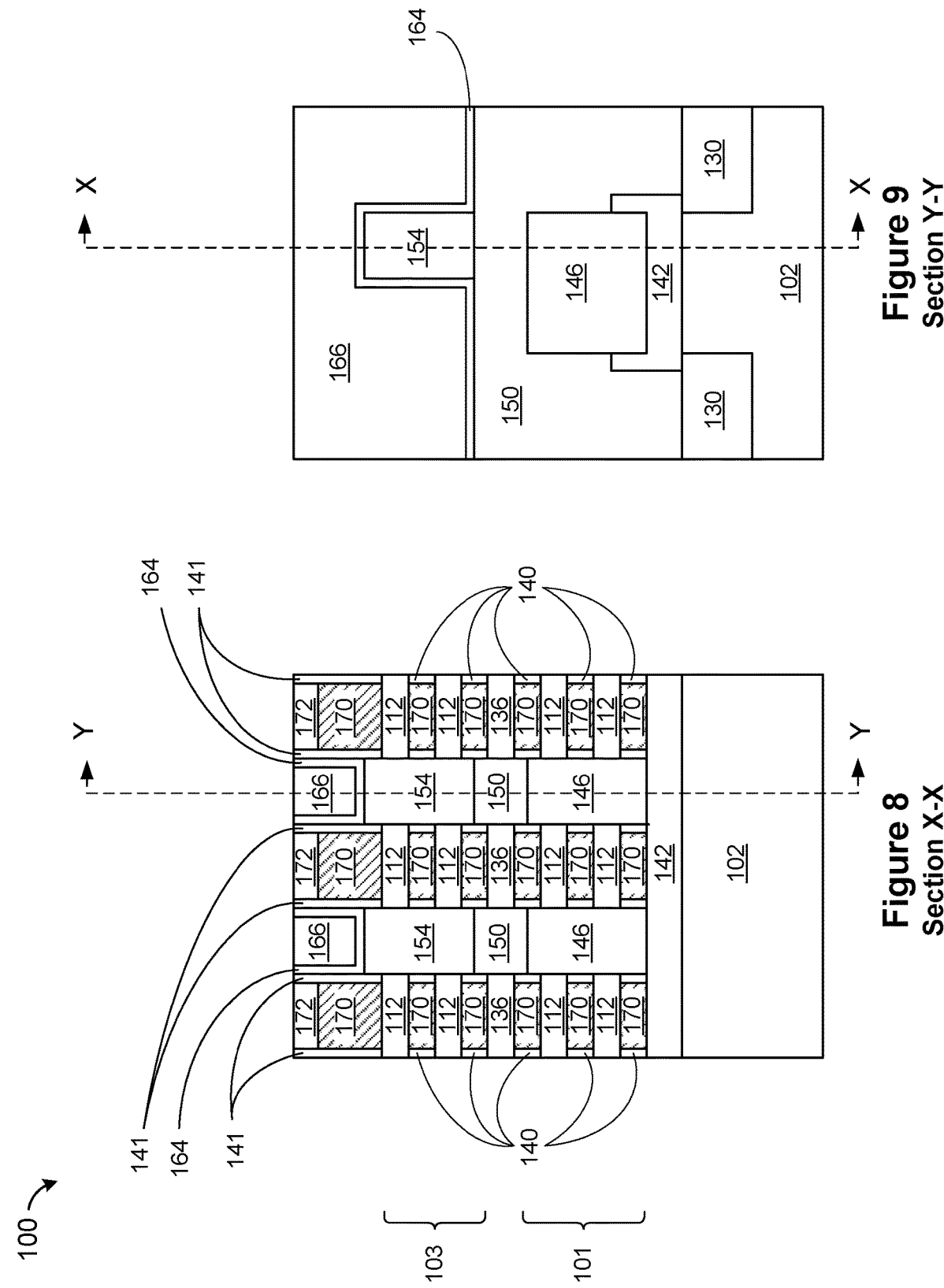

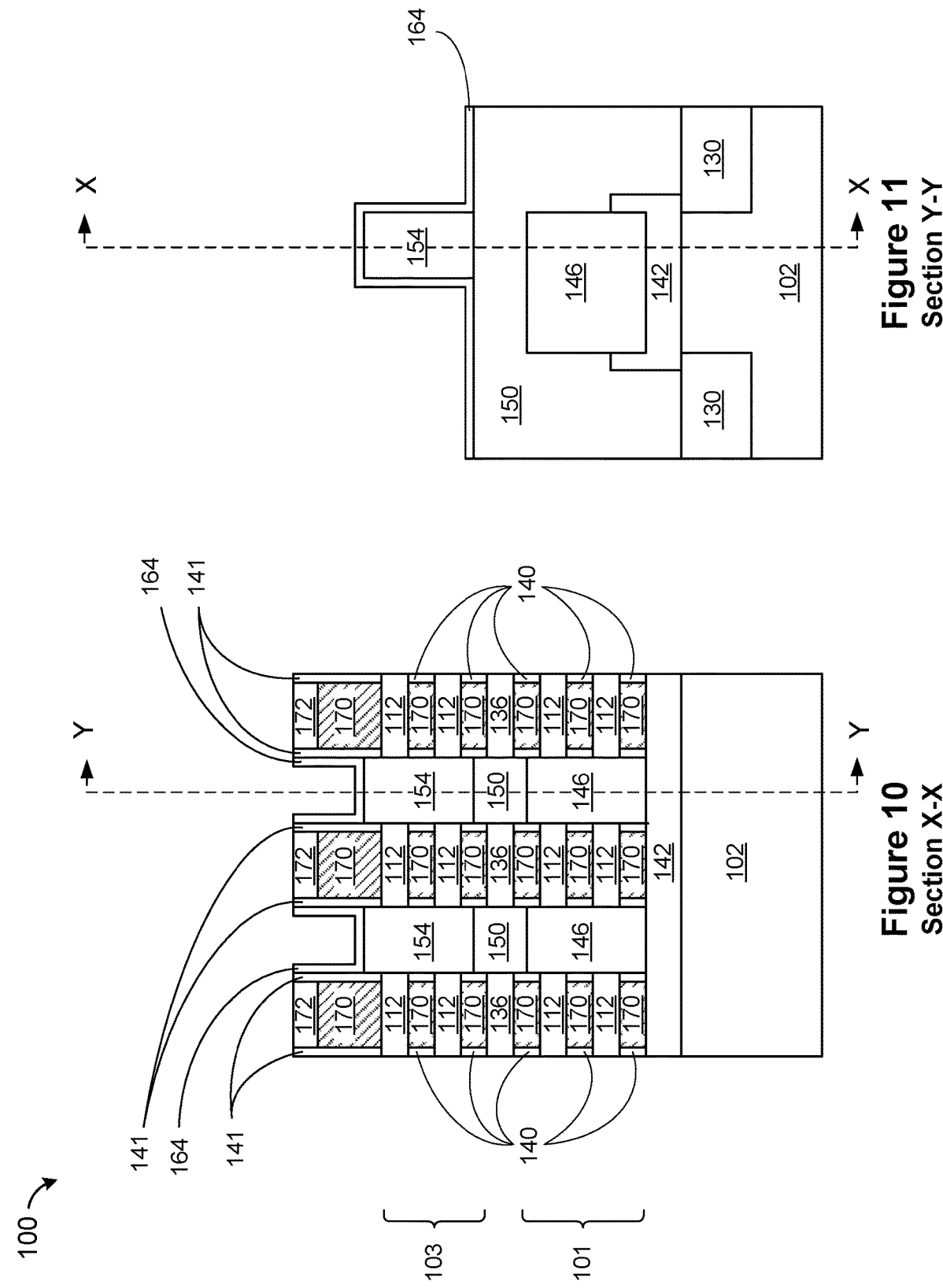

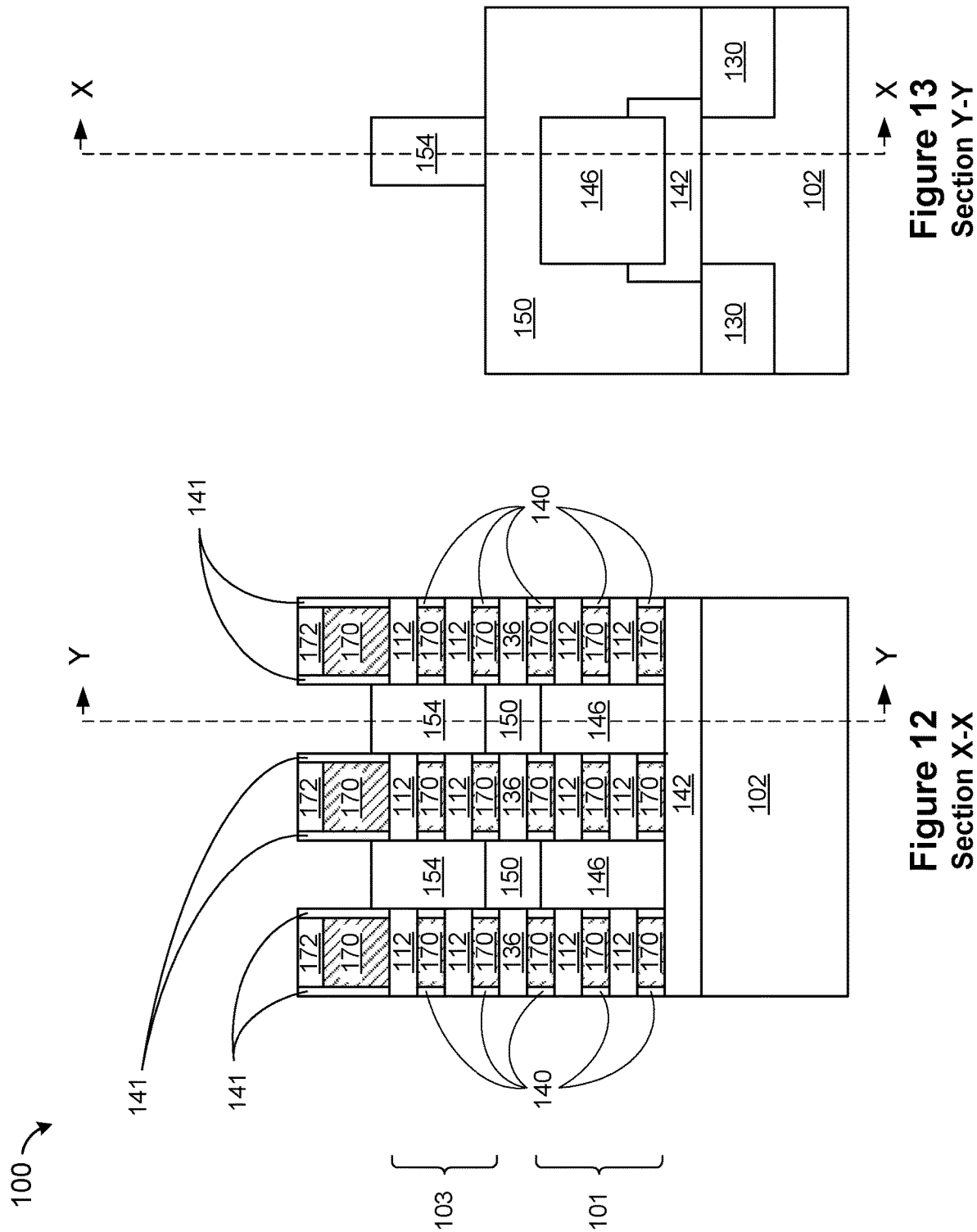

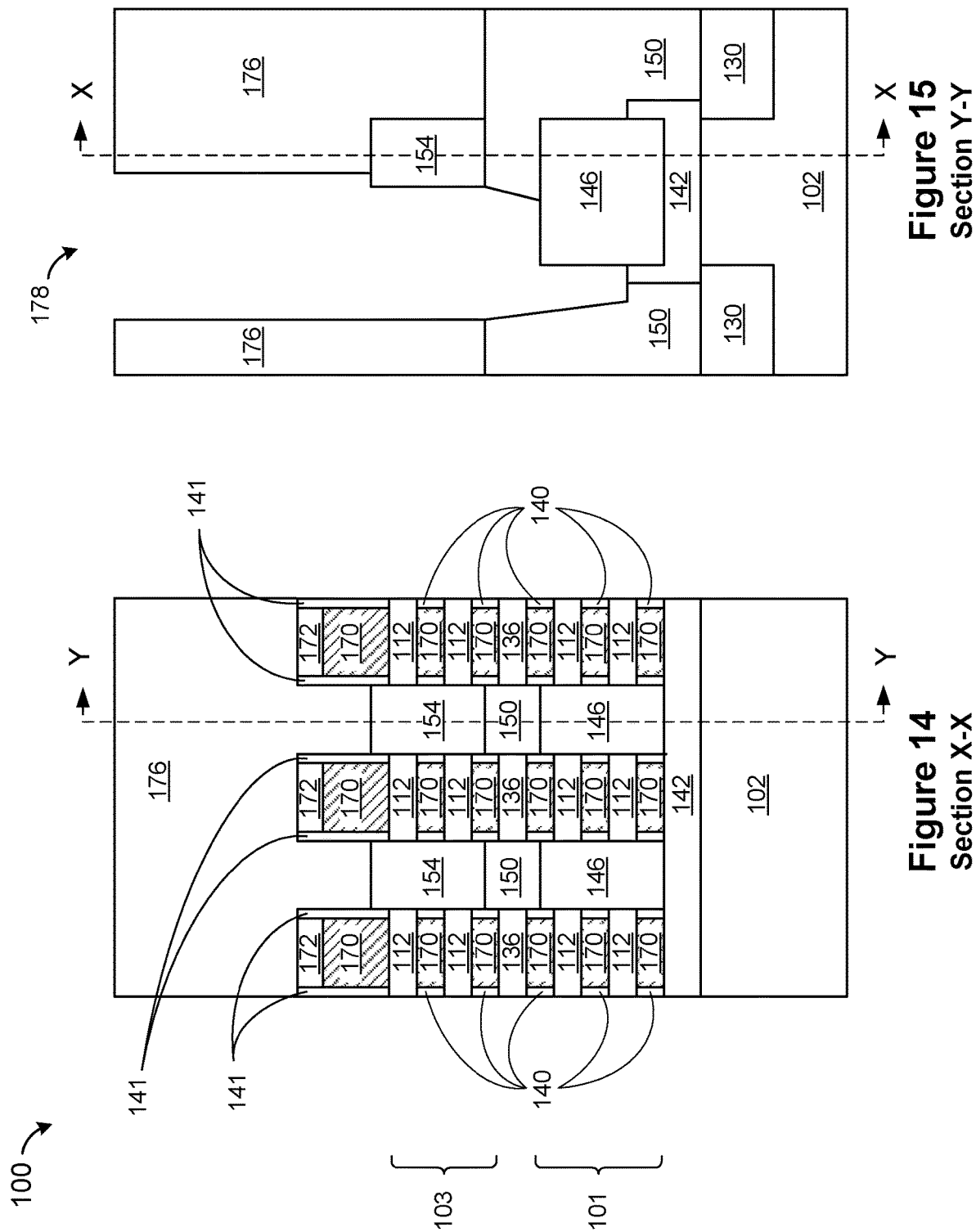

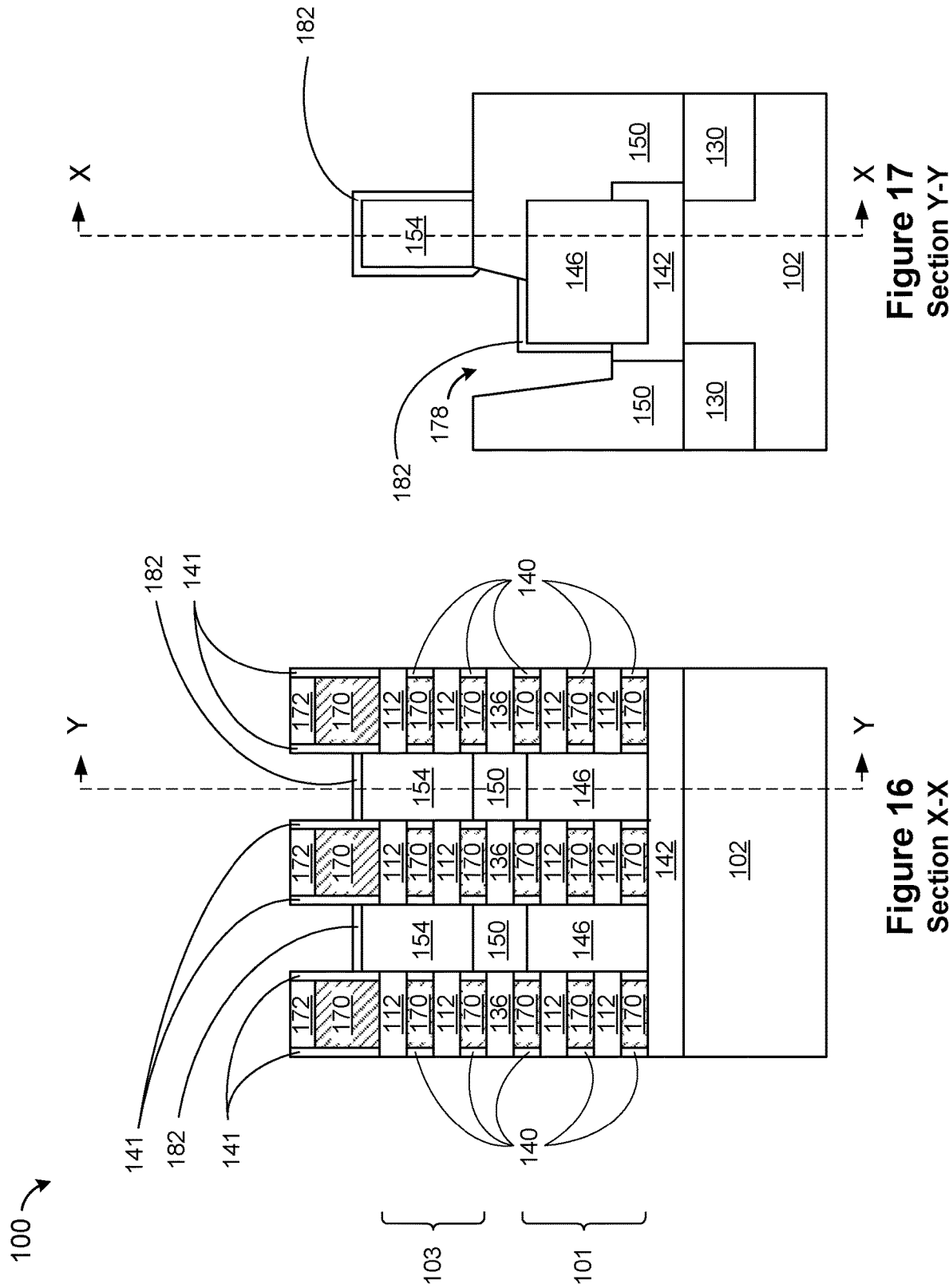

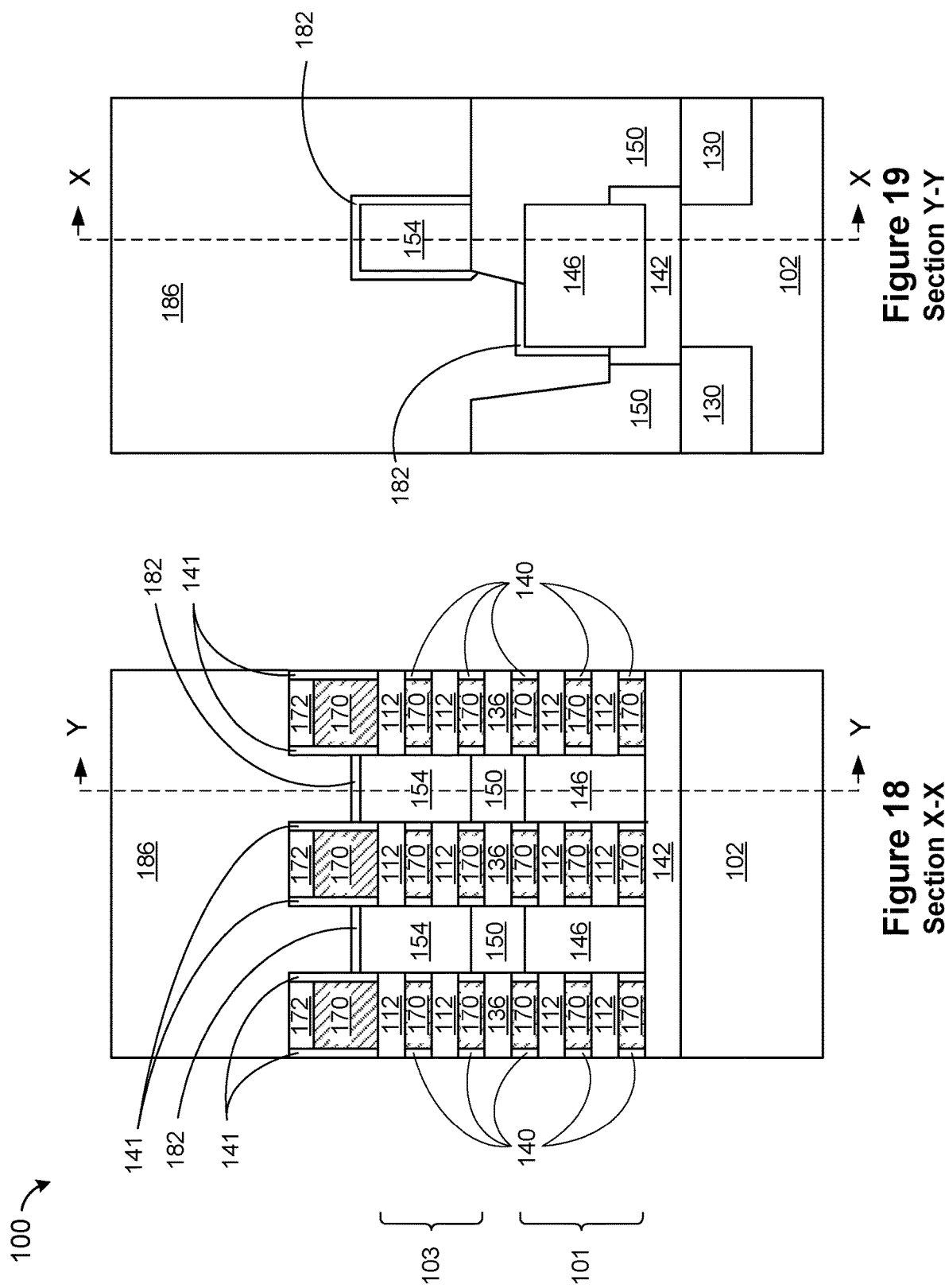

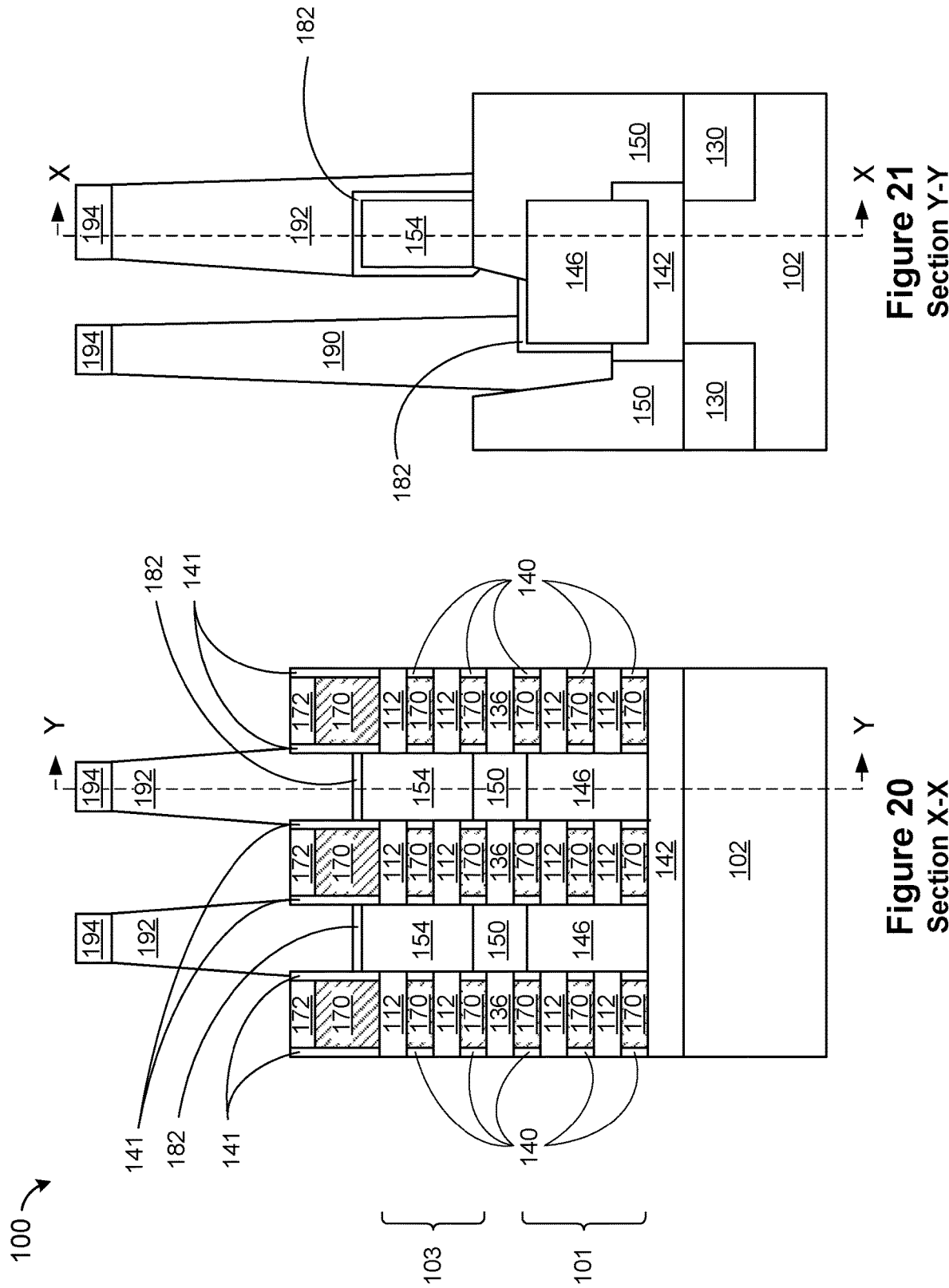

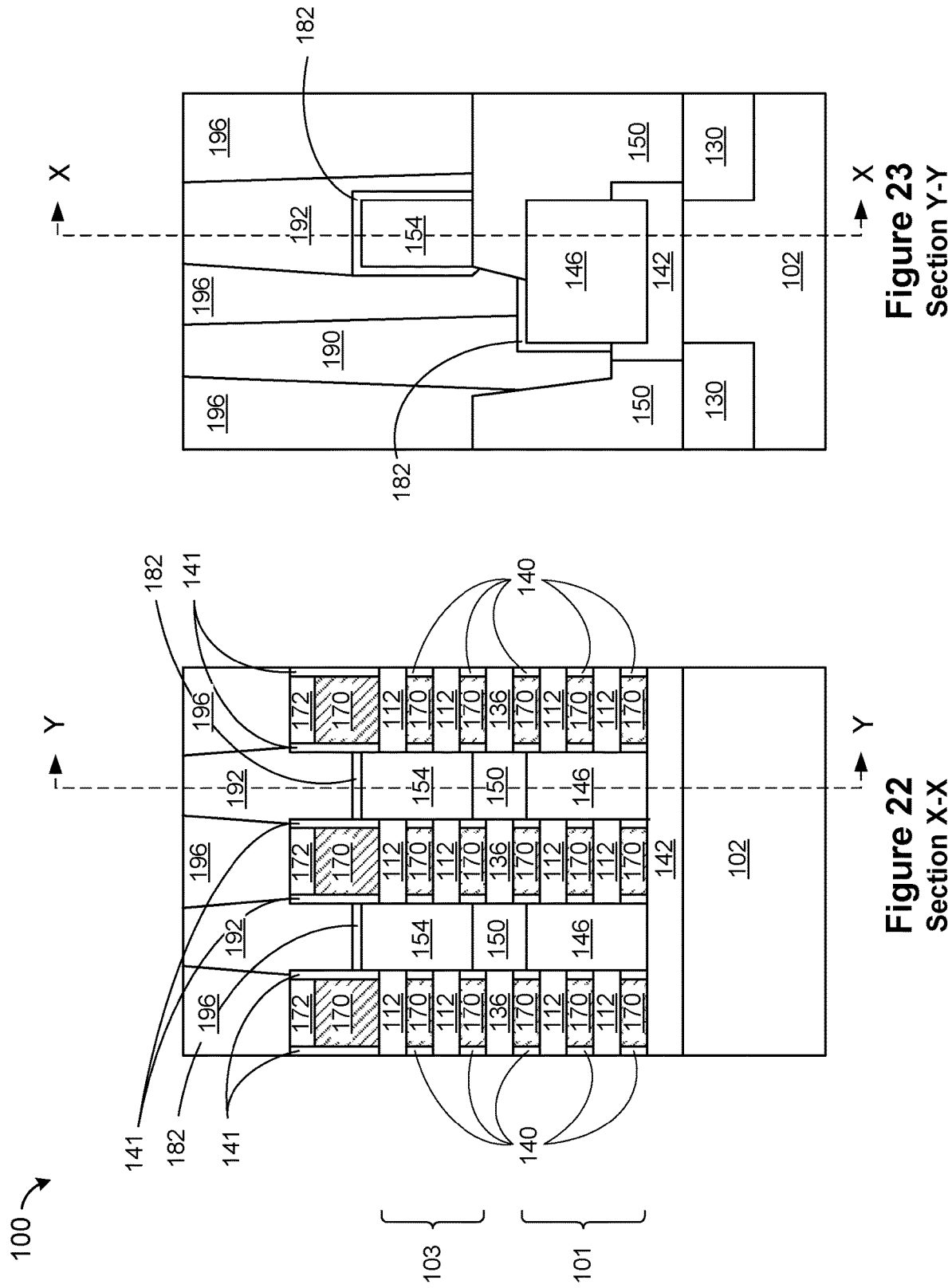

SUBTRACTIVE SOURCE DRAIN CONTACT FOR STACKED DEVICES

BACKGROUND

The present invention relates, generally, to the field of semiconductor manufacturing, and more particularly to subtractive source drain contacts for stacked field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. To reduce the footprint of the CMOS device, one approach is to stack one transistor over another transistor, such that device density is increased.

SUMMARY

According to an embodiment, a semiconductor device is provided. The semiconductor device including a field effect transistor ("FET") stack, the FET stack including a lower FET on a substrate, an upper FET vertically aligned and stacked on top of the lower FET and a dielectric layer between the lower FET and the upper FET, a first contact to a lower source drain of the lower FET, and a first silicide between the first contact and the lower source drain, where the first contact is adjacent to a vertical side surface of the lower source drain, where a first overlap region between the first silicide and the first contact is less than a second overlap region between the first silicide and the first source drain.

According to an embodiment, a semiconductor device is provided. The semiconductor device including a field effect transistor ("FET") stack, the FET including a lower FET on a substrate, an upper FET vertically aligned and stacked on top of the lower FET and a dielectric layer between the lower FET and the upper FET, a first contact to a lower source drain of the lower FET, and a first silicide between the first contact and the lower source drain, where the first contact is adjacent to a vertical side surface of the lower source drain, where a first overlap region between the first silicide and the first contact is less than a second overlap region between the first silicide and the first source drain, where the first contact has a reverse tapper metal stud profile, where a width at a lower surface of the first contact is wider than a width at an upper surface.

According to an embodiment, a method is provided. The method including forming a field effect transistor ("FET") stack on a substrate, the FET stack including an upper FET vertically aligned above a lower FET, the upper FET vertically aligned and stacked on top of the lower FET and a dielectric layer between the lower FET and the upper FET, and forming a first contact to a lower source drain of the lower FET, forming a first silicide between the first contact and the lower source drain, where the first contact is adjacent to a vertical side surface of the lower source drain, where a first overlap region between the first silicide and the first contact is less than a second overlap region between the first silicide and the first source drain.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 2 and 3 each illustrate a cross-sectional view of the semiconductor structure of FIG. 1 along section lines X-X and Y-Y, respectively, and FIG. 2 is perpendicular to FIG. 3, according to an embodiment;

FIGS. 4 and 5 illustrates a cross-sectional view of the semiconductor structure along section lines X-X and Y-Y, respectively, and illustrates formation of a liner and an interlayer dielectric, according to an embodiment;

FIGS. 6 and 7 illustrates a cross-sectional view of the semiconductor structure along section lines X-X and Y-Y, respectively, and illustrates removal of a sacrificial gate and removal of sacrificial layers, according to an embodiment;

FIGS. 8 and 9 illustrates a cross-sectional view of the semiconductor structure along section lines X-X and Y-Y, respectively, and illustrates formation of a replacement metal gate, according to an embodiment;

FIGS. 10 and 11 illustrates a cross-sectional view of the semiconductor structure along section lines X-X and Y-Y, respectively, and illustrates removal of the interlayer dielectric, according to an embodiment;

FIGS. 12 and 13 illustrates a cross-sectional view of the semiconductor structure along section lines X-X and Y-Y, respectively, and illustrates removal of the liner, according to an embodiment;

FIGS. 14 and 15 illustrates a cross-sectional view of the semiconductor structure along section lines X-X and Y-Y, respectively, and openings for bottom contact patterning, according to an embodiment;

FIGS. 16 and 17 illustrates a cross-sectional view of the semiconductor structure along section lines X-X and Y-Y, respectively, and illustrates removal of the bottom contact patterning material and formation of a liner, according to an embodiment;

FIGS. 18 and 19 illustrates a cross-sectional view of the semiconductor structure along section lines X-X and Y-Y, respectively, and illustrates contact patterning, according to an embodiment;

FIGS. 20 and 21 illustrates a cross-sectional view of the semiconductor structure along section lines X-X and Y-Y, respectively, and illustrates subtractive metal etch to define contacts, according to an embodiment; and FIGS. 22 and 23 illustrates a cross-sectional view of the semiconductor structure along section lines X-X and Y-Y, respectively, and illustrates formation of another interlayer dielectric, according to an embodiment.

Figure 1:
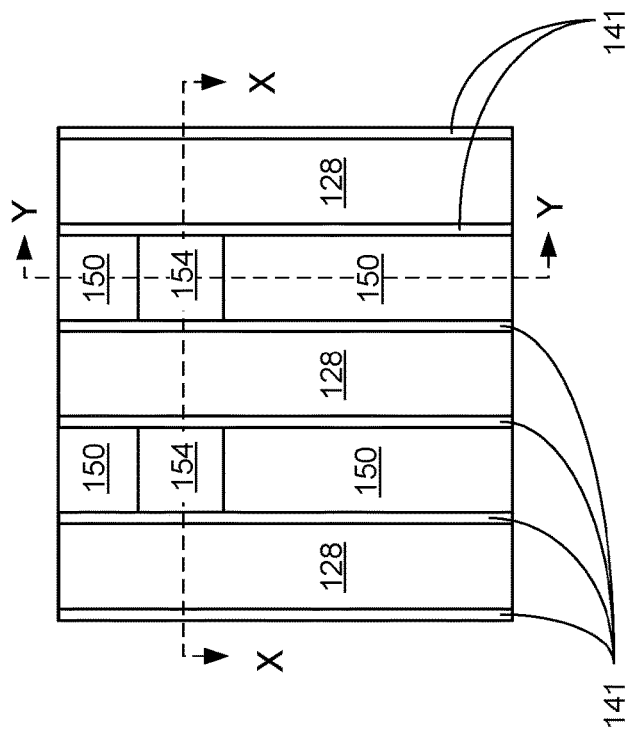
FIG. 1 illustrates a top view of a semiconductor structure at an intermediate stage of fabrication, according to an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Stacking two FETs or two nanosheet FETs, with an isolation layer between them, is an approach for increasing density of FETs. The stacked FET may include a negative channel FET (hereinafter "n-FET"), stacked on top of a positive channel FET (hereinafter "p-FET"), or the p-FET stacked on top of the n-FET. Alternatively, two n-FETs may be stacked on top of each other, or two p-FETs, may be stacked on top of each other.

When forming stacked FETs, individual contacts must be formed to the upper source drain region for the upper FET and to the lower source drain region for the lower FET. This results in a tall via from an upper surface of the structure to an upper surface of the lower source drain region. The tall via may have a high resistance due to small contact surface area between a portion of an upper horizontal surface of the lower source drain and the contact.

Additionally, forming a contact to the upper horizontal surface of the lower source drain may result in a contact in close proximity to a contact to the upper horizontal surface of the upper source drain. The resulting contacts may short to each other due to this proximity.

To ensure the two contacts for top and bottom are separated, a critical dimension of each via to each source drain is very small and a contact area is also small, leading to high contact resistance.

The present invention relates, generally, to the field of semiconductor manufacturing, and more particularly to subtractive source drain contacts for stacked field effect transistors. A method to form an upper source drain contact and a lower source drain contact may include forming a lower source drain which is wider than an upper source drain, forming a staircase type structure, forming a silicide on exposed portions of each the upper and lower source drain, forming two separated reverse tapered contacts to each the lower source drain and the upper source drain and forming a dielectric spacers surrounding the upper and lower source drains and the contacts to each.

The formation of the subtractive source drain contacts includes opening a contact trench in an interlayer dielectric surrounding a lower source drain, where the contact trench exposes a portion of a horizontal upper surface and a portion of a vertical side surface of the lower source drain, and exposes an upper horizontal surface of a bottom dielectric isolation region below a double stacked nanosheet. A horizontal upper surface and vertical side surfaces of the upper source drain may be exposed as well. A conformal silicide metal liner may be formed on the structure followed by a silicide anneal where the silicide metal liner reacts with exposed surfaces of the lower source drain and the upper source drain. Unreacted portions of the silicide metal liner may be removed from dielectrics such as the interlayer dielectric and exposed upper surface of the bottom dielectric isolation region. A blanket deposition of metal may be formed, filling the contact trench. Patterning and a subtractive metal etch may be performed. Resulting contacts to the upper source drain and to the lower source drain may have improved performance benefits than traditionally formed contacts for stacked FETs. The contact to the lower source drain may have a lower contact resistance due to a greater contact surface area, where the contact is formed to both the upper horizontal surface and the vertical side surface of the lower source drain. The contacts to the upper source drain and to the lower source drain may have increased spacing between them, as the contact to the lower source drain may be positioned centered on an edge between the horizontal upper surface and the vertical side surface furthest away from the upper source drain. Additionally, the resulting wrapped silicide between the lower source drain and the lower source drain contact, and the wrapped silicide between the upper source drain and the upper source drain contact helps to ensure good contact resistance for both the top and lower transistors by increasing the silicide area. An additional interlayer dielectric may be formed surrounding the contacts and remaining exposed surface areas of each the upper and the lower source drain. Furthermore, the subtractive metal contact formation forms a reverse tapper metal stud profile with a small critical dimension at an upper surface and a larger critical dimension at a lower surface for contacting each the upper and lower source drain. The subtractive metal contact helps to further reduce metal contact stud resistance and also helps to further reduce likelihood of contact shorting at an upper surface between the two contacts of the upper and the lower source drain.

Embodiments of the present invention disclose a structure and a method of forming a subtractive source drain contacts for stacked field effect transistors are described in detail below by referring to the accompanying drawings in FIGS. 1-23, in accordance with an illustrative embodiment. Please note that a stacked nanosheet device is used here for illustration purpose, the invention idea also works for stacked FinFET, stacked planar device, or hybrid stacked FET (such as FINFET over nanosheet device, or nanosheet device over FINFET, etc.)

Referring now to FIGS. 1, 2 and 3, a semiconductor structure 100 (hereinafter "structure") at an intermediate stage of fabrication is shown according to an exemplary embodiment. FIG. 1 is a top view of the structure 100. FIGS. 2 and 3 are each a cross-sectional view of the structure 100 along section lines X-X and Y-Y, respectively. FIGS. 2 and 3 are perpendicular to each other. The structure 100 of FIG. 1 may be formed or provided.

The structure 100 may include alternating layers of sacrificial semiconductor material and semiconductor channel material stacked one on top of another, a shallow trench isolation region (hereinafter "STI") 130, a sacrificial gate 126, a gate cap 128 and gate side spacers 141 on a substrate 102. It should be noted that, while a limited number of alternating layers are depicted, any number of alternating layers may be formed.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

The alternating layers of sacrificial semiconductor material and semiconductor channel material may include a sacrificial semiconductor material layer 110 (hereinafter "sacrificial layer"), covered by a semiconductor channel material layer 112 (hereinafter "channel layer"), covered by a sacrificial layer 110, covered by a channel layer 112, covered by a sacrificial layer 110, covered by a stack sacrificial layer (not shown), covered by a sacrificial layer 110, covered by a channel layer 112, covered by a sacrificial layer 110, covered by a channel layer 112, covered by a sacrificial layer 110. The alternating layers of sacrificial semiconductor material and semiconductor channel material may be formed over an epitaxial bottom sacrificial layer, (not shown).

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 110 is composed of a first semiconductor material which differs in composition from at least an upper portion of the substrate 102, the channel layer 112 and the stack sacrificial layer (not shown). In an embodiment, each sacrificial layer 110 may be a silicon-germanium semiconductor alloy and have a germanium concentration less than 50 atomic percent. In another example, each sacrificial layer 110 may have a germanium concentration ranging from about 20 atomic percent to about 40 atomic percent. Each sacrificial layer 110 can be formed using known deposition techniques or an epitaxial growth technique as described above.

Each channel layer 112 is composed of a second semiconductor material which differs in composition from at least the upper portion of the substrate 102, the sacrificial layer 110 and the stack sacrificial layer (not shown). Each channel layer 112 has a different etch rate than the first semiconductor material of sacrificial layer 110 and has a different etch rate than the stack sacrificial layer (not shown). The second semiconductor material can be, for example, silicon. The second semiconductor material, for each channel layer 112 can be formed using known deposition techniques or an epitaxial growth technique as described above.

The bottom sacrificial layer (not shown) and the stack sacrificial layer (not shown), may, for example, be silicon germanium with a germanium concentration about 60 atomic percent, although percentages greater than 60 percent and less than 60 percent may be used. The stack sacrificial layer (not shown) can be formed using an epitaxial growth technique. The stack sacrificial layer (now shown) will each subsequently be removed selective to the remaining alternating layers, as described below.

The alternating layers of sacrificial layer 110, channel layers 112, the bottom sacrificial layer (not shown) and stack sacrificial layer (not shown) can be formed by sequential epitaxial growth of alternating layers of the first semiconductor material, the second semiconductor material and the nanosheet stack sacrificial layer material.

The sacrificial layers 110 may have a thickness ranging from about 5 nm to about 15 nm, and the channel layers 112 may have a thickness ranging from about 3 nm to about 15 nm. Each sacrificial layer 110 may have a thickness that is the same as, or different from, a thickness of each channel layer 112. In an embodiment, each sacrificial layer 110 has an identical thickness. In an embodiment, each channel layer 112 has an identical thickness. The stack sacrificial layer (not shown) may have a thickness ranging from about 3 nm to about 15 nm.

The alternating layers of sacrificial layers 110, channel layers 112 and stack sacrificial layer (not shown) may be formed into nanosheet stacks, by methods known in the art.

The nanosheet stacks may have a length parallel to section line X-X and perpendicular to section lines Y1-Y1 and Y2-Y2. The nanosheet stacks may be formed by methods known in the arts, and include steps such as forming a hard mask (not shown) on the alternating layers, patterning the hard mask (not shown) and subsequent formation of one or more trenches (not shown), by removal of portions of each layer of the stacked nanosheet. The trench (not shown) may be formed between each nanosheet stack by an anisotropic etching technique, such as, for example, reactive ion etching (RIE), and stopping on etching a portion of the substrate 102 for subsequent formation of the STI 130 between each nanosheet stack. The hard mask (not shown) may be removed.

Each nanosheet stack may include a bottom sacrificial layer (not shown), a lower nanosheet stack 101 covered by a stack sacrificial layer (not shown), covered by an upper nanosheet stack 103. The lower nanosheet stack may include a sacrificial layer 110, covered by a channel layer 112, covered by a sacrificial layer 110, covered by a channel layer 112, covered by a sacrificial layer 110. The upper nanosheet stack may include a sacrificial layer 110, covered by a channel layer 112, covered by a sacrificial layer 110, covered by a channel layer 112.

The material stacks that can be employed in embodiments of the present invention are not limited to the specific embodiment illustrated in FIGS. 1, 2 and 3. In FIGS. 2 and 3, and only by way of an example, the lower nanosheet stack 101 includes three layers of sacrificial layers 110 alternating with two layers of the channel layers 112, and the upper nanosheet stack 103 includes two layers of sacrificial layers 110 alternating with two channel layers 112. The lower nanosheet stack 101 may be separated from the upper nanosheet stack 103 by the stack sacrificial layer (not shown).

The lower nanosheet stack 101 and the upper nanosheet stack 103 each can include any number of sacrificial layers 110 and channel layers 112. The nanosheet stack is used to produce a gate all around device that includes vertically stacked semiconductor channel material nanosheets for a pair of stacked p-FETs or a pair of stacked n-FETs, or a p-FET stacked on an n-FET or an n-FET stacked on a p-FET.

The formation of the trench, not shown, between each nanosheet stack may be formed by stopping on etching a portion of the substrate 102 for subsequent formation of the STI 130 between each nanosheet stack. The STI 130 may be patterned and formed selectively between nanosheet stacks in order to isolate one nanosheet stack from neighboring nanosheet stacks.

The STI 130 is formed in a portion of the trench (not shown). The STI 130 may be formed between adjacent nanosheet stacks in the portion of the trench (not shown), between adjacent nanosheet stacks. The STI 130 may be a dielectric material and may be formed using known deposition, planarization and etching techniques. A lower horizontal surface and a portion of a vertical side surface of the STI 130 may be adjacent to a lower horizontal surface and a vertical side surface of the substrate 102. The lower horizontal surface of the STI 130 may be below a lower horizontal surface of the bottom sacrificial layer (not shown). An upper horizontal surface of the STI 130 may be at a same level or above an upper horizontal surface of the lowermost sacrificial layer 110.

The sacrificial gate 126, the gate cap 128 and the gate side spacers 141 are formed orthogonal (perpendicular) to the nanosheet stacks. By way of illustration, three sacrificial gates 126 and three gate caps 128 are depicted in the drawings of the present application. The sacrificial gate 126 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 126 can include any material including, for example, polysilicon, amorphous silicon, or multilayered combinations thereof. The sacrificial gate 126 can be formed using any deposition technique including, for example, chemical vapor deposition (CVD), physical vapor deposition (PVD), high density plasma (HDP) deposition, and spin on techniques. Optionally, a gate dielectric layer (not shown) and the gate cap 128 may be formed as part of the sacrificial gate 126 in accordance with known techniques.

In an embodiment, the sacrificial gate 126 is deposited with a thickness sufficient to fill, or substantially fill, the spaces between adjacent nanosheet structures and cover a horizontal upper surface of the STI 130. The sacrificial gate 126 may be adjacent to vertical side surfaces of the nanosheet stack, including the lower nanosheet stack, the upper nanosheet stack and the stack sacrificial layer (not shown). The sacrificial gate 126 and surrounding gate side spacers 141 may cover an upper horizontal surface of an uppermost channel layer 112 of the nanosheet stack. A height of the sacrificial gate 126 may be much thicker than the underlying structure and may have a height between 100 nm and 150 nm about the nanosheet stack. The gate cap 128 may cover an upper horizontal surface and a vertical side surface of the sacrificial gate 126. The gate cap 128 may cover a portion of the upper horizontal surface of the uppermost sacrificial layer 110 of the nanosheet stack. The gate side spacers 141 may have a vertical side surface aligned with vertical side surfaces of the channel layers 112 and of the inner spacers 140. The gate side spacers 141 may have a vertical side surface adjacent to a vertical side surface of the sacrificial gate and a vertical side surface of the gate cap 128.

The bottom sacrificial layer (not shown) and the stack sacrificial layer (not shown) between the upper nanosheet stack 103 and the lower nanosheet stack 101 may be selectively removed using one or more known techniques selective to the channel layers 112, the sacrificial layers 110, the STI 130, the sacrificial gate 126, the cap 128 and the substrate 102. For example, a dry etching technique can be used to selectively remove the stack sacrificial layer (not shown), such as, for example, using vapor phased HCl dry etch.

An insulator layer may be formed where the bottom sacrificial layer (not shown) and the stack sacrificial layer (not shown) were removed. The insulator layer may be formed after several processes, including for example, conformally depositing or growing a dielectric and performing an anisotropic etch back process. The insulator layer may include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material. The insulator layer may have a thickness ranging from about 3 nm to about 15 nm. This process will form gate sidewall spacers 141, middle dielectric isolation layer 136, and bottom dielectric isolation (hereinafter "BDI") 142.

A source drain trench (not shown) may be formed along the nanosheet stack. The source drain trench (not shown) may be formed by an anisotropic etching technique, such as, for example, reactive ion etching (RIE). A lowermost surface of the source drain trench (not shown) may reach to the middle dielectric isolation layer 136. The anisotropic etching may remove aligned vertical portions of the stacked nanosheet stack between adjacent sacrificial gates 126, gate caps 128 and gate spacers 141. The sacrificial gate 126, the gate cap 128 and gate spacers 141 may protect remaining portions of the nanosheet stack. The vertical portion of the nanosheet stack may be recessed for subsequent formation of a source drain epitaxy in the source drain trench (not shown).

Portions of the sacrificial layers 110 may be selectively removed using known techniques. For example, a wet or dry etch process can be used with the appropriate chemistry to remove portions of each of the sacrificial layers 110. The material used for the etching process may be selective such that the channel layers 112, the middle dielectric isolation layer 136, the sacrificial gate 126, the gate cap 128, the STI 130, the BDI 142 and the substrate 102 remain and are not etched. After etching, portions of the sacrificial layers 110 covered on opposite sides by the sacrificial gate 126 may remain as part of the nanosheet stack. In such cases, the sacrificial gate 126 supports the remaining channel layers 112 and the middle dielectric isolation layer 136 of the nanosheet stack.

An inner spacer 140 may be formed where the portions of the sacrificial layers 110 have been removed. The inner spacer 140 may be formed by conformally depositing or growing a dielectric material, followed by a combination of dry and wet isotropic etch back steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch back process such as a reactive ion etch (RIE) and/or wet etch process, or any suitable etch process. In an embodiment, the inner spacer 140 may include one or more layers. In an embodiment, the inner spacer 140 may include any dielectric material such as silicon oxide, silicon oxynitride, silicon nitride, SiBCN, SiOC, low-k dielectric or any combination of these materials. In an embodiment, the inner spacer 140 may be nitride. In an alternate embodiment, the inner spacer 140 may be oxide.

The inner spacer 140 may completely fill in spaces between the channel layers 112, between the upper most channel layer 112 and the sacrificial gate 126 and the gate cap 128, and between the lowermost channel layer 112 and the substrate 102, where the portions of the sacrificial layers 110 had been previously removed.

A vertical side surface of the inner spacer 140 may be aligned with a vertical side surface of the channel layers 112 and a vertical side surface of the gate cap 128.

A lower source drain 146 may be epitaxially grown surrounding a vertical portion of the lower stack on opposite sides of the sacrificial gate 126. In this embodiment, the lower source drain 146 may surround the lower most two channel layers 112 and the lower most three sacrificial layers 110 with surrounding inner spacers 140 of the lower nanosheet stack 101. A portion of an upper surface of the BDI 142 may be above a lower surface of the lower source drain 146, as measured as a distance from an upper surface of the substrate 102. Another portion of an upper surface of the BDI 142 may be adjacent to a lower horizontal surface of the lower source drain 146. A vertical side surface of the BDI 142 may be adjacent to a vertical side surface of the lower source drain 146. During lower source drain 146 epitaxial growth, the upper nanosheet stack 103 may be protected by a sacrificial layer, or any epitaxial growth on the upper nanosheet stack 103, which may be subsequently recessed using, for example, a dry etch process.

An interlayer dielectric (hereinafter "ILD") 150 may be formed by depositing or growing a dielectric material, followed by a combination of dry and wet etch and recessing steps. The ILD 150 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an etch process such as wet etch or a reactive ion etch (RIE), or any suitable etch process. In an embodiment, the ILD 150 may include one or more layers. In an embodiment, the ILD 150 may include any dielectric material such as silicon oxide, silicon oxynitride, silicon nitride, SiBCN, SiOC, low-k dielectric or any combination of these materials. In an embodiment, the ILD 150 may be a nitride. In an alternate embodiment, the ILD 150 may be an oxide. The ILD 150 may surround the middle dielectric isolation layer r 136 and the surrounding sacrificial layers 110 with surrounding inner spacers 140. A portion of the ILD 150 may surround and separate adjacent lower source drains 146. A lower horizontal surface and a vertical surface of the ILD 150 may be adjacent to an upper horizontal surface and a vertical surface of the lower source drain 146. lower horizontal surface and a vertical surface of the ILD 150 may be adjacent to an upper horizontal surface and of the STI 130. A lower horizontal surface and a vertical surface of the ILD 150 may be adjacent to an upper horizontal surface and a vertical surface of the BDI 142.

An upper source drain 154 may be epitaxially grown surrounding a vertical portion of the upper stack on opposite sides of the sacrificial gate 126. In this embodiment, the upper source drain 154 may surround the upper most two channel layers 112 and the upper most two sacrificial layers 110 with surrounding inner spacers 140 of the upper nanosheet stack 103. The upper source drain 154 may be adjacent to an upper surface of the ILD 150. An upper surface of the upper source drain 154 may be higher than an upper surface of the uppermost channel layer 112.

As shown in FIG. 3, a width of the lower source drain 146 may be greater than a width of the upper source drain 154. The lower source drain 146 may be larger than the upper source drain 154. The resulting structure may be referred to as a 'staircase structure'.

Referring now to FIGS. 4 and 5, the structure 100 is shown according to an exemplary embodiment. FIGS. 4 and 5 are each a cross-sectional view of the structure 100 along section lines X-X and Y-Y, respectively. FIGS. 4 and 5 are perpendicular to each other. A liner 164 and an interlayer dielectric (hereinafter "ILD") 166 may be formed.

The liner 164 may be formed conformally on the structure 100. The liner 164 may be formed by depositing or growing a dielectric material. The liner 164 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the liner 164 may include one or more layers. In an embodiment, the liner 164 may include any dielectric material such as silicon nitride (SiNx), silicon boron carbonitride (SiBCN), or SiNC. In an embodiment, the liner 164 may be 2 to 6 nanometers thick. In a preferred embodiment, the liner 164 may include SiN.

The liner 164 may be adjacent to an upper horizontal surface and a vertical side surface of the upper source drain 154. The liner 164 may be adjacent to a vertical side surface of the ILD 166 surrounding the gate side spacer 141 surrounding the sacrificial gate 126.

The ILD 166 may be conformally formed on the structure 100 as described for the ILD 150. The ILD 166 may be formed on the liner 164. The ILD 166 may fill a space above the upper source drain 154, within the liner 164.

A chemical mechanical polishing (CMP) technique may be used to remove excess material and polish upper surfaces of the structure 100, removing portions of the ILD 166, portions of the liner 164 and removing the gate cap 128 and exposing an upper surface of the sacrificial gate 126. A resulting horizontal upper surface of the structure 100 may include upper horizontal surfaces of the gate side spacers 141, the gate cap 126, the liner 164 and the ILD 166.

Referring now to FIGS. 6 and 7, the structure 100 is shown according to an exemplary embodiment. FIGS. 6 and 7 are each a cross-sectional view of the structure 100 along section lines X-X and Y-Y, respectively. FIGS. 6 and 7 are perpendicular to each other. The sacrificial gate 126 and the sacrificial layers 110 may be removed.

The sacrificial gate 126 may be removed by methods known in the arts. An upper surface of the uppermost channel layer 112 may be exposed. Vertical side surfaces of the gate side spacers 141 may be exposed.

The sacrificial layers 110 are removed selective to the channel layers 112, the inner spacers 140, the liner 164, the ILD 166, the ILD 150, the middle dielectric isolation layer 136, the upper source drain 154, the lower source drain 146, the STI 130, the BDI 142 and the substrate 102. The remaining channel layers 112 and the middle dielectric isolation layer 136 are shown suspended and are supported on both ends by the upper source drain 154 and the lower source drain 146 which are not shown. For example, a dry etch process can be used to selectively remove the sacrificial layers 110, such as using vapor phased HCl dry etch.

Referring now to FIGS. 8 and 9, the structure 100 is shown according to an exemplary embodiment. FIGS. 8 and 9 are each a cross-sectional view of the structure 100 along section lines X-X and Y-Y, respectively. FIGS. 8 and 9 are perpendicular to each other. A gate 170 and a cap 172 may be formed.

The gate 170 may be conformally formed on the structure 100, according to an exemplary embodiment. The gate 170 is formed in each cavity of the nanosheet stack and surrounding suspended portions of the channel layers 112. The gate 170 forms a layer surrounding exposed portions of the nanosheet stacks. The gate 170 may cover an exposed upper horizontal surface of the STI 130, an exposed upper horizontal surface of the substrate 102, an exposed upper horizontal surface of the BDI 142, exposed vertical side surfaces of one side of the side spacers 140 and exposed vertical side surfaces of one side of the gate side spacers 141. The gate 170 may cover vertical side surfaces, an upper horizontal surface and a lower horizontal surface of the channel layers 112. The gate 170 may cover vertical side surfaces, an upper horizontal surface and a lower horizontal surface of the middle dielectric isolation layer 136.

The gate 170 may be deposited using typical deposition techniques, for example, atomic layer deposition (ALD), molecular layer deposition (MLD), and chemical vapor deposition (CVD).

In an embodiment, the gate 170 may include more than one layer, for example, a conformal layer of a high-k gate dielectric, such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$. The gate 170 may further include a work function metal (WFM) over the high-k gate dielectric. The material chosen for the WFM, and any high-k dielectric, may be selected based on a desired threshold voltage, in combination with other materials and properties as described above. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

In an embodiment, the work function metal for the lower nanosheet stack 101 may be different than the work function metal for the upper nanosheet stack 103. Specifically, the work function metal for the lower nanosheet stack 101 may be for a p-FET device and the work function metal for the upper nanosheet stack 103 may be for an n-FET device, or vise-versa. An optional conductive metal, such as W or Al can be further deposited over the WFM. After that, the gate 170 can be recessed using dry or wet etch process.

The cap 172 may be formed in the gate recess region. The cap 172 may cover an upper horizontal surface of the gate 170 between a pair of gate side spacers 141.

A chemical mechanical polishing (CMP) technique may be used to remove excess material and polish upper surfaces of the structure 100. A resulting upper horizontal surface may include an upper horizontal surface of the cap 172, the gate side spacers 141, the liner 164 and the ILD 166.

Referring now to FIGS. 10 and 11, the structure 100 is shown according to an exemplary embodiment. FIGS. 10 and 11 are each a cross-sectional view of the structure 100 along section lines X-X and Y-Y, respectively. FIGS. 10 and 11 are perpendicular to each other. The ILD 166 may be removed.

The ILD 166 may be selectively removed by methods known in the arts. The ILD 166 may be removed selective to the cap 172, the gate side spacers 141, the liner 164.

Referring now to FIGS. 12 and 13, the structure 100 is shown according to an exemplary embodiment. FIGS. 12 and 13 are each a cross-sectional view of the structure 100 along section lines X-X and Y-Y, respectively. FIGS. 12 and 13 are perpendicular to each other. The liner 164 may be removed.

The liner 164 may be selectively removed by methods known in the arts. The liner 164 may be removed selective to the cap 172, the gate side spacers 141, the upper source drain 154, the ILD 150.

Referring now to FIGS. 14 and 15, the structure 100 is shown according to an exemplary embodiment. FIGS. 14 and 15 are each a cross-sectional view of the structure 100 along section lines X-X and Y-Y, respectively. FIGS. 14 and 15 are perpendicular to each other. An organic planarization layer (hereinafter "OPL") 176 may be formed and an opening 178 may be formed.

The OPL 176 may be deposited on the structure 100. The OPL 176 may be formed by a blanket deposition using typical deposition techniques, for example spin-on coating. The OPL 176 can be a self-planarizing organic material that includes carbon, hydrogen, oxygen, and optionally nitrogen, fluorine, and silicon. The OPL 176 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A conventional lithography process may be used to define the opening 178. The opening 178 may be made by removing a portion of the OPL 176 and a portion of the ILD 150. The opening 178 may be formed using a combination of etching techniques to selectively remove portions of the OPL 176 selective to the upper source drain 154 and may be done in multiple steps. Additional removal to form the opening 178 may include removal using an anisotropic etching technique, such as, for example, reactive ion etching (RIE), and stopping at the lower source drain 142 for subsequent formation of a contact to the lower source drain 142.

A vertical side surface of the opening 178 may include a vertical side surface of the OPL 176, a vertical side surface of the upper source drain 154, a vertical side surface of the lower source drain 146 and a vertical side surface of the ILD 150. A horizontal lower surface of the opening 178 may include an upper horizontal surface of the ILD 150, an upper horizontal surface of the BDI 142, an upper horizontal surface of the lower source drain 146 and an upper horizontal surface of the lower source drain 146.

Referring now to FIGS. 16 and 17, the structure 100 is shown according to an exemplary embodiment. FIGS. 16 and 17 are each a cross-sectional view of the structure 100 along section lines X-X and Y-Y, respectively. FIGS. 16 and 17 are perpendicular to each other. The OPL 176 may be removed and a silicide 182 may be formed.

The OPL 176 may be removed using one or more known techniques selective to the upper source drain 154, the BDI 142, the lower source drain 146, the STI 130, the substrate 102, the channel layers 112, the side spacers 140, the cap 172 and the gate side spacer 141.

A metal liner (not shown) may conformally deposited on the structure 100. The metal liner may include nickel (Ni), titanium (Ti), cobalt (Co) and nickel platinum (NiPt), etc. The structure may be subjected to an anneal which results in a reaction on a surface of each the lower source drain 146 and the upper source drain 154, between the epitaxial material and the metal liner, which forms silicide 182. The silicide 182 can be nickel silicide (NiSi), titanium disilicide (TiSi), cobalt monosilicide (CoSi), nickel platinum silicide (NiPtSi), etc. Unreacted portions of the metal liner may be removed.

The silicide 182 may be formed on exposed surfaces of the upper source drain 154 and on exposed surfaces of the lower source drain 146. The silicide 182 may be formed on an upper horizontal surface and on vertical side surfaces of the upper source drain 154. The liner 182 may be formed on a portion of a vertical side surface and on a portion of a horizontal upper surface of the lower source drain 146.

The silicide 182 may be referred to as a "contact area", and forming the silicide 182 on exposed surfaces of the lower source drain 146 and the upper source drain 154 increases contact area between the lower source drain 146 and the upper source drain 154 and subsequently formed contacts to each.

Referring now to FIGS. 18 and 19, the structure 100 is shown according to an exemplary embodiment. FIGS. 18 and 19 are each a cross-sectional view of the structure 100 along section lines X-X and Y-Y, respectively. FIGS. 18 and 19 are perpendicular to each other. A conductive metal 186 may be deposited.

The conductive metal 186 may be conformally formed on the structure 100, according to an exemplary embodiment. The conductive metal 186 is formed in each cavity, such as the opening 178. The conductive metal 186 may cover an upper horizontal surface and a vertical side surface of the ILD 150, an upper horizontal surface and a vertical side surface of the liner 182, an upper horizontal surface of the BDI 142, an upper horizontal surface and a vertical side surface of the gate side spacers 141, and an upper horizontal surface of the cap 172.

The conductive metal 186 may be deposited using typical deposition techniques, for example, atomic layer deposition (ALD), molecular layer deposition (MLD), and chemical vapor deposition (CVD). In an embodiment, the conductive metal 186 may include, for example, tungsten (W), ruthenium (Ru) and cobalt (Co), and may include a thin adhesion metal liner deposited prior to the conductive metal deposition, such as TiN.

Referring now to FIGS. 20 and 21, the structure 100 is shown according to an exemplary embodiment. FIGS. 20 and 21 are each a cross-sectional view of the structure 100 along section lines X-X and Y-Y, respectively. FIGS. 20 and 21 are perpendicular to each other. A hard mask 194 may be formed and portions of the conductive metal 186 may be removed, forming an upper source drain contact 192 and a lower source drain contact 190.

The hard mask 194 may be formed and patterned using methods known in the arts. Portions of the conductive metal 186 may be removed using conventional lithography and anisotropic etching technique selective to the hard mask 194, such as, for example, reactive ion etching (RIE), and stopping on etching a portion of the ILD 150, the silicide 182, the gate side spacers 141 and the cap 172. Remaining portions of the conductive metal 186 may form the upper source drain contact 192 and the lower source drain contact 190.

Referring now to FIGS. 22 and 23, the structure 100 is shown according to an exemplary embodiment. FIGS. 22 and 23 are each a cross-sectional view of the structure 100 along section lines X-X and Y-Y, respectively. FIGS. 22 and 23 are perpendicular to each other. An interlayer dielectric (hereinafter "ILD") 196 may be formed.

The ILD 196 may be conformally formed on the structure 100 as described for the ILD 150. A chemical mechanical polishing (CMP) technique may be used to remove excess material and polish upper surfaces of the structure 100, removing the hard mask 194, portions of the ILD 196, portions of the upper source drain contact 192 and portions of the lower source drain contact 190. A resulting horizontal upper surface of the structure 100 may include upper horizontal surfaces of the upper source drain contact 192, the lower source drain contact 190 and the ILD 194.

The resulting structure includes subtractive source drain contacts with improved lower contact resistance to both the upper source drain contact 192 and the lower source drain contact 190, and increased spacing at an upper surface of the structure 100 between the upper source drain contact 192 and the lower source drain contact 190. Additionally, the silicide 182 between the upper source drain contact 192 and the upper source drain 154 and also between the lower source drain contact 190 and the lower source drain 142 helps to improve contact and contact area. The upper source drain contact 192 and the lower source drain contact 190 each have a tapered vertical side surface which is wider at a lower surface connected to each source drain. The advantage of the tapered side surface of the upper source drain contact 192 and the lower source drain contact 190 includes increased spacing between the contacts at an upper surface and also a lower contact resistance between the upper source drain contact 192 and the lower source drain contact 190 and each source drain due to a larger surface contact area. Additionally, the lower source drain contact 190 has a larger surface area to both a vertical side surface and a horizontal upper surface of the lower source drain 146 compared to traditional contacts to stacked FET nanosheet devices.

As shown in the Figures, for the lower source drain 146, an overlap region between the lower source drain contact 190 and the silicide 182, is less than an overlap region between the silicide 182 and the lower source drain 146. This means that, for the lower source drain 146, there is a larger silicide 182 area on the lower source drain 146 compared to a critical dimension (CD) of a contact area of the source drain 146. More specifically, a critical dimension of the contact of the lower source drain 146 is larger than a critical dimension of the contact of the upper source drain 154. This results in a good contact to the bottom source drain 146 with maximized bottom contact critical dimension, without creating a shorting issue at an upper surface of the structure 100 between the upper source drain contact 192 and the lower source drain contact 190.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a field effect transistor ("FET") stack, the FET stack comprising a lower FET on a substrate, an upper FET vertically aligned and stacked on top of the lower FET and a dielectric layer between the lower FET and the upper FET; and
   a first contact to a lower source drain of the lower FET, wherein the first contact comprises a tapered profile such that a width of a lower surface of the first contact is wider than a width of an upper surface of the first contact.

2. The semiconductor device according to claim 1, further comprising:
   a first silicide between the first contact and the lower source drain.

3. The semiconductor device according to claim 1, wherein a first critical dimension of a lower surface of the first contact is larger than a second critical dimension of an upper surface of the first contact.

4. The semiconductor device according to claim 1, wherein the first contact is adjacent to a horizontal upper surface of the lower source drain.

5. The semiconductor device according to claim 1, further comprising:
   a second contact to an upper source drain of the upper FET, wherein the second contact is adjacent to a vertical side surface of the upper source drain; and
   a second silicide between the second contact and the upper source drain.

6. The semiconductor device according to claim 1, wherein the upper FET comprises an upper source drain, wherein an upper horizontal surface of the lower source drain of the lower FET is larger than an upper horizontal surface of the upper source drain of the upper FET.

7. The semiconductor device according to claim 1, wherein the lower FET comprises alternating layers of a metal gate and a semiconductor channel material vertically aligned and stacked one on top of another, and wherein the upper FET comprises alternating layers of the metal gate and the semiconductor channel material vertically aligned and stacked one on top of another.

8. The semiconductor device according to claim 7, wherein the upper FET comprises an upper source drain, wherein the upper source drain directly contacts sidewalls of the alternating layers of the semiconductor channel material of the upper FET; and wherein the lower source drain directly contacts sidewalls of the alternating layers of the semiconductor channel material of the lower FET.

9. A semiconductor device comprising:
   a field effect transistor ("FET") stack, the FET stack comprising a lower FET on a substrate, an upper FET vertically aligned and stacked on top of the lower FET and a dielectric layer between the lower FET and the upper FET; and
   a first contact to a lower source drain of the lower FET, wherein the first contact comprises a tapered profile such that a width of a lower surface of the first contact is wider than a width of an upper surface of the first contact, and wherein the first contact extends partially along both a vertical sidewall and a top surface of the lower source drain.

10. The semiconductor device according to claim 9, wherein a first critical dimension of a lower surface of the first contact is larger than a second critical dimension of an upper surface of the first contact.

11. The semiconductor device according to claim 9, wherein the first contact is adjacent to a horizontal upper surface of the lower source drain.

12. The semiconductor device according to claim 9, further comprising:
   a second contact to an upper source drain of the upper FET, wherein the second contact is adjacent to a vertical side surface of the upper source drain.

13. The semiconductor device according to claim 1, wherein the upper FET comprises an upper source drain, wherein an upper horizontal surface of the lower source drain of the lower FET is larger than an upper horizontal surface of the upper source drain of the upper FET.

14. The semiconductor device according to claim 9, wherein the lower FET comprises alternating layers of a metal gate and a semiconductor channel material vertically aligned and stacked one on top of another, and wherein the upper FET comprises alternating layers of the metal gate and the semiconductor channel material vertically aligned and stacked one on top of another.

15. The semiconductor device according to claim 14, wherein the upper FET comprises an upper source drain, wherein the upper source drain directly contacts sidewalls of the alternating layers of the semiconductor channel material of the upper FET; and wherein the lower source drain directly contacts sidewalls of the alternating layers of the semiconductor channel material of the lower FET.

16. A method comprising:
   forming a field effect transistor ("FET") stack on a substrate, the FET stack comprising an upper FET vertically aligned above a lower FET, the upper FET vertically aligned and stacked on top of the lower FET and a dielectric layer between the lower FET and the upper FET;

forming a first contact to a lower source drain of the lower FET, wherein the first contact has a tapered profile such that width at a lower surface of the first contact is wider than a width at an upper surface; and forming a first silicide between the first contact and the lower source drain.

17. The method according to claim 16, wherein the first contact extends partially along both a vertical sidewall and a top surface of the lower source drain.

18. The method according to claim 16,
wherein a first critical dimension of a lower surface of the first contact is larger than a second critical dimension of an upper surface of the first contact.

19. The method according to claim 16, further comprising:
forming a second contact to an upper source drain of the upper FET, wherein the second contact is adjacent to a vertical side surface of the upper source drain and wherein an upper horizontal surface of the lower source drain of the lower FET is larger than an upper horizontal surface of an upper source drain of the upper FET.

20. The method according to claim 19, wherein
the lower FET comprises alternating layers of a metal gate and a semiconductor channel material vertically aligned and stacked one on top of another,
the upper FET comprises alternating layers of the metal gate and the semiconductor channel material vertically aligned and stacked one on top of another,
the upper source drain surrounding and physically connected to the alternating layers of the semiconductor channel material of the upper FET, and
the lower source drain surrounding and physically connected to the alternating layers of the semiconductor channel material of the lower FET.

* * * * *